(12) United States Patent
Brongersma et al.

(10) Patent No.: US 6,495,453 B1
(45) Date of Patent: Dec. 17, 2002

(54) METHOD FOR IMPROVING THE QUALITY OF A METAL LAYER DEPOSITED FROM A PLATING BATH

(75) Inventors: Sywert H. Brongersma, Leuven (BE); Emmanuel Richard, Mennecy (FR); Iwan Vervoort, Hoogstraten (BE); Karen Maex, Herent (BE)

(73) Assignee: Interuniversitair Microelectronica Centrum, Leuven (BE)

( * ) Notice: Subject to any disclaimer, the term of this patent is extended or adjusted under 35 U.S.C. 154(b) by 0 days.

(21) Appl. No.: 09/599,133

(22) Filed: Jun. 22, 2000

Related U.S. Application Data
(60) Provisional application No. 60/140,484, filed on Jun. 22, 1999.

(30) Foreign Application Priority Data

Sep. 24, 1999 (EP) .............................. 99870194

(51) Int. Cl.$^7$ ............................... H01L 21/44
(52) U.S. Cl. ................... 438/660; 438/663; 438/678; 438/687
(58) Field of Search ................ 438/678, 687, 438/658, 660, 663

(56) References Cited

U.S. PATENT DOCUMENTS

| | | | | |
|---|---|---|---|---|
| 5,773,363 A | * | 6/1998 | Derderian et al. | 438/672 |
| 5,913,147 A | * | 6/1999 | Dubin et al. | 438/687 |
| 6,043,149 A | * | 3/2000 | Jun | 438/658 |
| 6,077,780 A | * | 6/2000 | Dubin | 438/687 |
| 6,204,192 B1 | * | 3/2001 | Zhao et al. | 438/723 |
| 6,207,553 B1 | * | 3/2001 | Buynoski et al. | 438/622 |

FOREIGN PATENT DOCUMENTS

| | | |
|---|---|---|
| EP | 0 524 818 A1 | 1/1993 |
| EP | 0 709 887 A2 | 1/1996 |
| EP | 0 709 887 A3 | 8/1996 |

OTHER PUBLICATIONS

Patent Abstracts of Japan; Publication No.: 10176225; Pub Date: Jun. 30, 1998; Applicant: Daido Steel Co. Ltd.; Title: Continuous Annealing Furnace of Metallic Strip.

* cited by examiner

*Primary Examiner*—Carl Whitehead, Jr.
*Assistant Examiner*—Christy Novacek
(74) *Attorney, Agent, or Firm*—Knobbe, Martens, Olson & Bear LLP

(57) ABSTRACT

The present invention is related to a method for depositing a metal-containing film from a metal plating bath, comprising the steps of subsequently depositing a metal-containing layer from a metal plating bath followed by a heating step and/or a vacuum step, said subsequent steps being repeated for a number of times in different sequences.

15 Claims, 3 Drawing Sheets

SEM cross-section images of ECD Cu taken at various stage of overfill formation at the top of 0.4 μm wide isolated and dense trenches

METHOD FOR IMPROVING THE QUALITY OF A METAL LAYER DEPOSITED FROM A PLATING BATH

RELATED APPLICATION

The present application claims the priority of U.S. provisional patent application Ser. No. 60/140,484 filed Jun. 22, 1999.

FIELD OF THE INVENTION

The present invention relates to semiconductor processing and more particularly to a method for improving the quality of a metal-containing layer deposited from a plating bath.

BACKGROUND OF THE INVENTION

Currently, copper is being introduced in ULSI metallization schemes as a replacement for aluminum due to its lower resistivity and better electromigration resistance. Copper is used as conductive path. Several techniques for deposition of copper are known, among which electroless copper plating, electrochemical copper plating and copper chemical vapor deposition.

Although Al and $SiO_2$ are still widely used in interconnect technology, copper and new low-K materials (e.g. polymers) are rapidly being implemented in microelectronics as they are now accepted as the future materials of choice. This major change is necessitated by the ever-decreasing feature sizes that have indicated RC delay-time to be the limiting factor of the next generation of microprocessors. With the use of copper, a lower resistance is obtained which, depending on many processing parameters, may be combined with a better resistance to electromigration.

At the same time the use of damascene structures has been recently introduced as means of fabricating very narrow structures (less than 0.25 $\mu$m). In this scheme narrow trenches or via's are first etched in to the low-K material, which are then subsequently filled with Cu. As the depth/width ratio of these structures increases, filling without creating voids or even closing the structure at the top becomes increasingly difficult. Therefore, brighteners and Suppressors are added to the plating solution. The terms brighteners and Suppressors are known to the person skilled in the art (cf. below). For depositing a copper layer from a copper plating bath, techniques such as electrochemical plating or electroless plating of copper are presently the preferred methods. After depositing the copper layer, a thermal anneal step is usually performed.

However, there are still problems related to the quality of the deposited metal film.

When structures comprising broader openings (like wide trenches and bonding pads or capacitors; typically linewidth higher than 3 $\mu$m) and narrower openings (like trenches and via's) need to be filled, hillocks are formed over the narrow openings while the broader openings are filled conformally. This results in the commonly encountered phenomenon of overfilling, resulting in hillocks above the trenches that cause the as-deposited film to locally be as much as twice the normal thickness. This causes severe problems for the subsequent step of chemical-mechanical processing (CMP) which works best on planar films. Apart from CMP, thickness variations of the film is an additional factor that hampers grain-boundary motion.

Although the negative effects on the topography of the deposited copper layer are known, deposition of copper layers from a plating bath is currently the most used technique. Other techniques such as Chemical Vapor Deposition result in less reliable layers and are more expensive.

The deposited copper films by plating can also show a high stress in the layer. They also can by plating exhibit a high sheet resistance.

Another problem that occurs is that the deposited copper layer shows a detrimental adhesion to the underlying layer such as a copper diffusion barrier layer or a dielectric layer.

The above mentioned problems are not limited to the deposition of a copper layer but occur also for other metal layers, for instance a cobalt layer. When a cobalt layer is deposited from a plating bath, the cobalt layer shows the adverse characteristics as mentioned above.

The method of the present invention aims to solve the problems related to the methods for deposition of a metal-containing layer from a plating bath. It is an aim of the invention to provide a solution to the problems related to the properties of a metal-containing layer deposited from a plating bath in ULSI metallization structures.

SUMMARY OF THE INVENTION

In a first aspect of this invention, a method for depositing a metal-containing film from a metal plating bath on a substrate is described. This method includes the steps of depositing a metal-containing layer from the metal plating bath in order to obtain a deposited metal-containing layer; performing a heating step and/or a vacuum step, whereby impurities incorporated in the deposited metal-containing layer or adhered to the surface of the deposited metal-containing layer are substantially eliminated; and depositing an additional metal-containing layer from the metal plating bath on the deposited metal containing layer.

The step of performing a heating and/or the step of performing a vacuum or the step of depositing the metal-containing layer can be repeated for a number of times in different sequences, whereby all openings in the insulating layer are substantially filled with the deposited metal-containing layers.

In an embodiment of this first aspect of the invention, the metal-containing layer can be a copper layer or a cobalt layer.

In a further embodiment of this first aspect of the invention, the step of performing a vacuum comprises exposing a deposited metal-containing layer in an air/vacuum-cycle.

In a further embodiment of this first aspect of the invention, the metal-containing layer is deposited in at least one narrow opening in a surrounding insulating layer wherein the narrow opening is part of an ULSI metallization structure.

In a further embodiment of this first aspect of the invention, the narrow opening can be a trench, contact hole or via as known in semiconductor processing.

In a further embodiment of this first aspect of the invention, a metal-containing seed layer is deposited prior to the deposition on the substrate of a metal-containing layer from the metal plating bath.

In a further embodiment of this first aspect of the invention, the metal plating bath can be an electroless metal-containing plating bath or an electrolytic metal-containing plating bath.

In a second aspect of this invention, a method for depositing a metal-containing film from a metal plating bath on a substrate having a narrow opening in an insulating layer is disclosed, including the steps of depositing a metalcontaining layer from a metal plating bath on the substrate in order to have a deposited metal-containing layer in at least one opening; performing a heating step and/or a vacuum step on the deposited metal-containing layer, whereby impurities incorporated in the deposited metal-containing layer or adhered to the surface of the deposited metal-containing layer are substantially eliminated; and repeating both the depositing step and the heating and/or vacuum step one or more times.

In an embodiment of this second aspect of the invention, the metal-containing layer can be a copper layer or a cobalt layer.

In a further embodiment of this second aspect of the invention, the step of performing a vacuum comprises exposing the deposited metal-containing layer in an air/vacuum-cycle.

In a further embodiment of this second aspect of the invention, the opening is a narrow opening in an insulating layer in an ULSI metallization structure.

In a further embodiment of this second aspect of the invention, the narrow opening can be a trench, contact hole or via as known in semiconductor processing.

In a further embodiment of this second aspect of the invention, a metal-containing seed layer is deposited prior to the deposition on the substrate of a metal-containing layer from the metal plating bath.

In a further embodiment of this second aspect of the invention, the plating bath can be either an electroless plating bath or an electrolytic plating bath.

DETAILED DESCRIPTION OF THE PREFERRED EMBODIMENT

Figure 1:
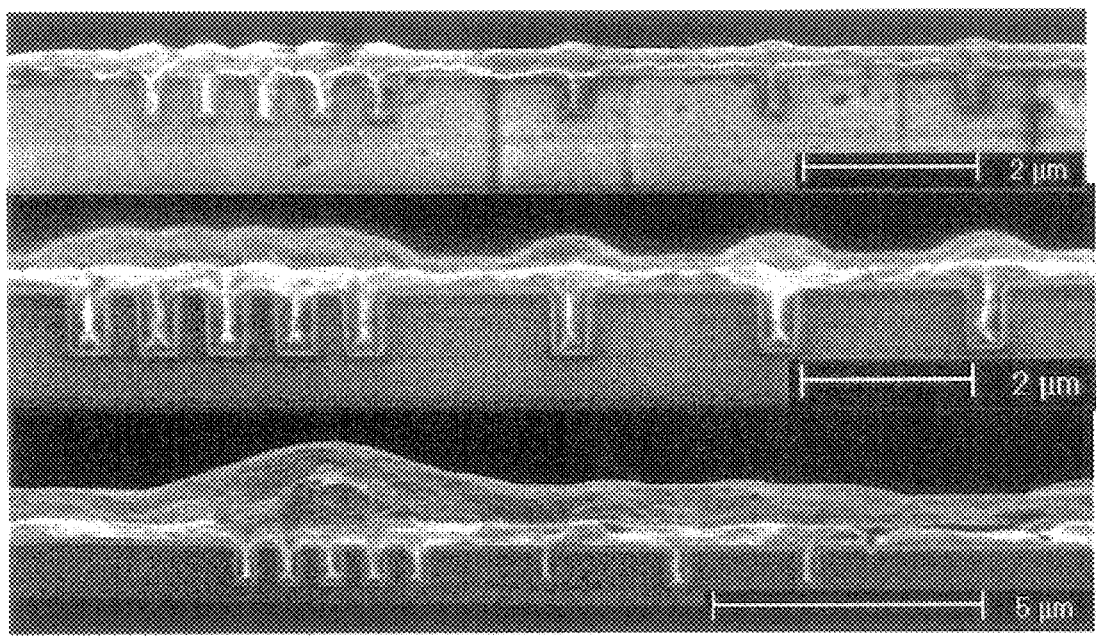
FIG. 1 represents a SEM cross-section image of Electrochemically Deposited Cu (ECD Cu) at various stages of overfill formation showing the situation of Cu deposition according to the state of the art.

According to an aspect of this invention, the problems related to the properties of a metal-containing layer deposited by a plating process on ULSI metallization schemes as mentioned in the background of the invention, can be avoided by eliminating impurities which are present in the metal plating bath and which are adhered to the surface of the substrate. This aspect of the method of the invention is not limited to the elimination of impurities in a deposited copper layer but can be valid for a multitude of metal-containing layers which are deposited using a metal plating bath. For the purpose of this invention, impurities can be defined as compounds being present in a plating bath, except the metal source molecules (or ions) and compounds which are adhered on the surface of the substrate. The impurities can be additives added to the plating solution to improve the plating of the metal or can be compounds which are accidentally present in the plating bath.

It is known in the art that the bottom-up fill of openings with a high aspect ratio can be obtained through the addition of several organic additives to the plating bath solution. Typical additives are, but are not limited hereto, so-called suppressors and so-called brighteners. A suppressor is known by a person skilled in the art as a surfactant polymer that forms an adsorbed polymeric film on the metal surface such that the free sites are effectively reduced for other bath constituents. Consequently, the growth is suppressed. Typical examples are, but are not limited hereto, polymers formulated from polyethylene glycol (PEG), polypropylene glycol (PPG), and many highly branched derivatives thereof. A brightener (also called accelerator or anti-suppressor) enhances Cu deposition, counteracts the action of the suppressor and reduces metal grain size. Typical examples are, but are not limited hereto organic disulfides and alkylation derivatives of polyethylene imines. Another class of additives are so-called levelers. This class of additives provides a more planar metal-containing layer with less pronounced hillocks.

Typically, additives are organic molecules, organic polymeric molecules and smaller molecules that appear in electrochemical plating baths. These molecules can contain, i.e., sulfur, carbon, hydrogen, or chlorine. Those additives can be incorporated in the deposited metal-containing layer or can be present on the surface of the deposited metal-containing layer. Surprisingly, it was observed that when these materials are incorporated in the metal-containing layer during metal deposition from a plating bath or are present on the surface of the deposited metal-containing layer after deposition from a plating bath, these additives have a negative impact on the quality of the deposited layer.

The additives are part of the impurities in or on the surface of the as-deposited film and have a large impact on both the deposition itself, and on subsequent grain growth and processing. The adverse effects of the impurities affect the quality of the deposited metal-containing layer. For example, hillocks can be formed above trenches or via's because the smaller molecules among the additives in the plating bath accumulate in the trenches and via's which have an accelerating effect on grain growth above these structures even after they've been filled completely. Consequently, CMP of the metal film layer is hampered. Other observed problems include bad adhesion to the layer underlying the metal film, high stress and a high sheet resistance in the deposited metal film.

This can be alleviated through elimination of the impurities. The elimination of the impurities can, for instance, be done by a thermal anneal step or by exposing the deposited layer to several air/vacuum cycles, or both. A thermal anneal step can be performed in a temperature range higher than room temperature. The temperature ranges are typically, but not limited to, 30–600° C., 50–500° C., 80–400° C., 100–300° C. and preferably between 300 and 400° C. The time period for the anneal is typically between 5 sec. and 10 min, 5 sec. and 5 min, 10 sec and 2 min and preferably between 20 sec and 90 sec. The anneals can be performed in a Rapid Thermal Processing furnace or in a conventional furnace under an inert gas ambient ($N_2$, Ar, Kr, He) or a $H_2/N_2$ ambient or a $NH_3$ ambient or any other annealing ambient commonly used in semiconductor device processing.

The air/vacuum cycle is defined as alternately exposing the deposited metal-containing layer to an atmosphere of air or another gas such as $N_2$, $H_2$, Ar, He, Kr, $NH_3$, or any mixture thereof, at atmospheric pressure and exposing the deposited metal-containing layer to an atmosphere of air or another gas such as $N_2$, $H_2$, Ar, He, Kr, $NH_3$, or any mixture thereof, or vacuum at a pressure below atmospheric pressure. The pressure below atmospheric pressure is typically, but not limited to, the range between atmospheric pressure and $10^{-2}$ to $10^{-4}$, $10^{-6}$ and $10^{-8}$ Torr. The elimination of the impurities can also be performed at room temperature in an $H_2$ ambient.

When structures in ULSI metallization schemes need to be filled like structures comprising bonding paths (typically linewidth higher than 5 μm) and structures with a high aspect ratio like trenches and via's, hillocks are formed over the structures with a high aspect ratio, while bonding paths are filled conformally (see FIG. 1). Probably, those hillocks above trenches or via's are formed because the smaller molecules among the additives accumulate in the trenches and via's and on the surface of the deposited metal film. The impurities continue to have an accelerating effect on grain growth above these structures even after they have been filled completely.

In this invention, a method is disclosed for depositing a metal-containing film from a metal plating bath on a substrate having at least one opening in an insulating layer. The opening can be, but is not limited hereto, a trench, via, contact hole, bonding path or a capacitor. This method comprises the steps of depositing a metal-containing layer from said metal plating bath on said substrate until at least one opening is substantially filled with said metal-containing layer, performing a heating step and/or a vacuum step on said deposited metal-containing layer and depositing a metal containing layer on said deposited metal-containing layer. The steps of performing a heating step and/or vacuum step and/or said step of depositing said second metal-containing layer can subsequently be repeated for a number of times in different sequences until all openings are substantially filled with said metal-containing layer. The heating or vacuum step is performed to eliminate impurities incorporated in the deposited metal-containing layer or impurities present on the surface of the deposited metal-containing layer.

According to an embodiment of the invention, the forming of those hillocks can be avoided by first filling the opening with a metal to a thickness that is sufficient to complete the bottom-up fill of the structures with the highest aspect ratio. Afterwards, the impurities present in or on the first metal-containing layer are eliminated by a thermal anneal step or by exposing the deposited layer to several air/vacuum cycles or both. In a following step, further deposition is performed to a thickness sufficient for planarization. In this way, the forming of hillocks is avoided (see FIG. 2) and CMP can easily be performed.

Another problem that occurs in prior art processing is that the deposited copper films can show a high stress. Exposing the deposited metal-containing layer to a thermal anneal step or several air/vacuum cycles or both will eliminate the impurities and thus reduce the stress.

Finally, the as deposited copper layer according to prior art processing shows a bad adhesion to the underlying layer, such as a copper diffusion barrier layer or a dielectric layer. Additives, like small molecules containing sulfur, carbon or sulfur, or hydrogen, can migrate to the interface of the metal-containing layer and the surrounding layers and consequently reduce the adhesion properties. Elimination of those additives (impurities) by exposing the deposited metal-containing layer to a thermal anneal step or several air/vacuum cycles or both will reduce the adhesion problem.

In a description of a first embodiment of the invention, a Cu barrier layer, a Cu seed layer or another metal-containing layer is deposited in an opening in an insulating layer (step 0). The opening in the insulating layer can be an opening with a high aspect ratio, i.e., an aspect ratio of 1/2 or 1/5 or 1/10. This opening can also be an opening with a linewidth higher than 5 μm, i.e. a bonding path or a capacitor. The copper barrier layer can be Co, Ta, Ti, TiN, TaN, $Si_3N_4$, $W_xN$, or compounds thereof. The metal-containing layer can be, i.e., a cobalt layer. In a next step during electrochemical deposition (ECD) of copper (called step 1), deposition proceeds to a thickness that is sufficient to complete the bottom-up fill of the narrow structures.

Thereafter, a further step (step 2) must be included to eliminate local variations in the concentrations of incorporated species and of those adhered to the surface. This may be done by either a thermal anneal or by taking the sample through several air/vacuum cycles (as defined as steps 2a and 2b respectively). This means that the plating may be interrupted. For example, the sample may be taken out of the plating chamber, causing an initial top-down crystallization to occur. The thermal anneal method (step 2a) causes much of the material to be cleaned, but also induces a thermal stress and secondary grain growth.

The air/vacuum cycle (step 2b) removes the unwanted material without causing secondary grain growth, and actually reduces the stress to near-zero values. It is known to reduce concentrations to large depths. Additionally, it may improve adhesion, as the induced diffusion is more one-directional (towards the surface) than for a thermal anneal.

In a next processing step (step 3) the wafer is returned to the ECD-chamber (electrochemical copper deposition) for further deposition in order to fill large structures to a sufficient thickness for planarization. This is necessary because large structures exhibit conformal filling rather than bottom-up filling. The growth obtained in this step will depend on which of the two possibilities in step 2 is chosen, as one causes large grains and thermal stress in the material (according to step 2a), while grains stay relatively small in the other processing mode (step 2b).

Before going to the CMP step (called step 5), another anneal (step 4) may be included here to obtain large grains that accelerate the CMP process. It may certainly help to stabilize the structure by preventing self-anneal, thereby making the CMP process independent of the timing of the process itself with respect to the deposition. Also, depending on which process was chosen in step 2, the final grain-size in the trenches and via's may depend on whether an anneal is done before or after CMP as nucleation for growth is different before and after the top layer is removed.

A final anneal (step 6) may be needed in order to stabilize/optimize the grain-structure.

In a description of a second embodiment of the invention, a Cu barrier layer, a Cu seed layer or another metal-containing layer is deposited in an opening in an insulating layer using a metal plating bath (step 0). The opening in the insulating layer can be an opening with a high aspect ratio, i.e., an aspect ratio of 1/2 or 1/5 or 1/10. This opening can also be an opening with a linewidth higher than 5 μm, i.e. a bonding path or a capacity. The copper barrier layer can be based on Co, Ta, and Ti. The metalcontaining layer can be, i.e., a cobalt layer. One of the group of the Cu barrier layer, Cu seed layer or another metal-containing layer is deposited on the opening in the insulating layer and do not completely fill the opening (step 1).

A further step must be included to eliminate local variations in the concentrations of incorporated species (impurities) and of those adhered to the plated surface. This may be done by either a thermal anneal or by taking the sample through several air/vacuum cycles (respectively defined as step 2a and 2b). This means that the plating may be interrupted. For example, the sample must be taken out of the chamber, causing an initial top-down crystallization to occur.

In a following step (defined as step 3), deposition of copper from a plating bath proceeds to a thickness that is sufficient to complete the bottom-up fill of the narrow structures.

Again, a further step (step 4) can be included to eliminate local variations in the concentrations of incorporated species and of those adhered to the surface. This may be done by either a thermal anneal or by taking the sample through several air/vacuum cycles (respectively defined as step 4a and 4b). For both choices the sample must be taken out of the chamber, causing an initial top-down crystallization to occur. The first processing mode (step 4a) causes much of the material to be cleaned, but also induces a thermal stress and secondary grain growth. The second processing mode (step 4b) removes the unwanted material without causing secondary grain growth, and actually reduces the stress to near-zero values. It is known to reduce concentrations to large depths. Additionally, it may improve adhesion, as the induced diffusion is more one-directional (towards the surface) than for a thermal anneal.

Thereafter the wafer is returned to the ECD-chamber for further deposition (defined as step 5) in order to fill large structures to a sufficient thickness for planarization. This is necessary because large structures exhibit conformal filling rather than bottom-up filling. The growth obtained in this step will depend on which of the two possibilities in steps 2 and 4 was chosen, as one causes large grains and thermal stress in the material (step 2a, 4a), while grains stay relatively small in the other (step 2b, 4b).

Before going to the CMP step, another anneal (step 4b) may be included here to obtain large grains that accelerate the CMP process. It may certainly help to stabilize the structure by preventing self-anneal, thereby making the CMP process independent of the timing of the process itself with respect to the deposition. Also, depending on which process mode was chosen in step 2 or 4, the final grain size in the trenches and via's may depend on whether an anneal is done before or after CMP as nucleation for growth is different before and after the top layer is removed.

A final anneal may be needed in order to stabilize/optimize the grain-structure (step 6).

EXAMPLES

Figure 2:
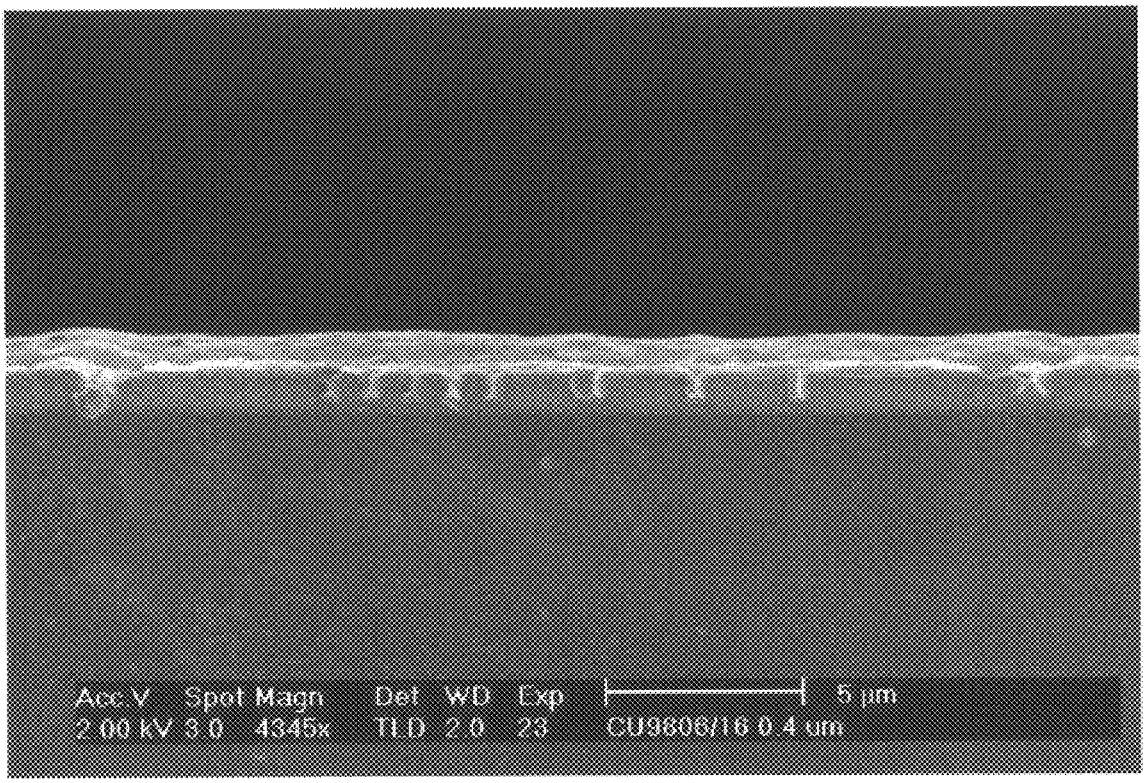
FIG. 2 represents SEM cross-section image of ECD Cu using the process according to an embodiment the present invention.

Experiments were performed on 6 and 8 inch silicon wafers using a commercially available copper sulfate based plating bath and organic additives developed for IC filling and commercially available from Shipley. Wafers received a TaN barrier layer and a Cu seed layer that were plasma sputtered on dielectric patterned substrates. Two kinds of organic additives were used: one called "brightener" and an other one called "Suppressor", as commercially provided by the company Shipley. Suppressor concentration was kept constant. The analysis of those additives in the plating bath was based on Cyclic Voltametric Stripping technique. The copper ECD layers were deposited using a Semitool Equinox® fountain plater. A high-resolution profilometer HRP220 from KLA was used to measure surface topography of the Cu ECD layer deposited overlying patterned dies. Structures with various widths of lines were chosen for this evaluation. For focussed ion beam (FIB) imaging and SEM pictures, a FEI200 and Philips XL30 were used respectively. Typical resulting structures are shown in FIG. 2.

The sequence that was used for this embodiment consisted of inserting an anneal treatment after filling trench to get the same surface grain size and help desorption. This sequence maintained a void-free deposit and limited the increasing step-height undesirable for the CMP process.

Figure 3:
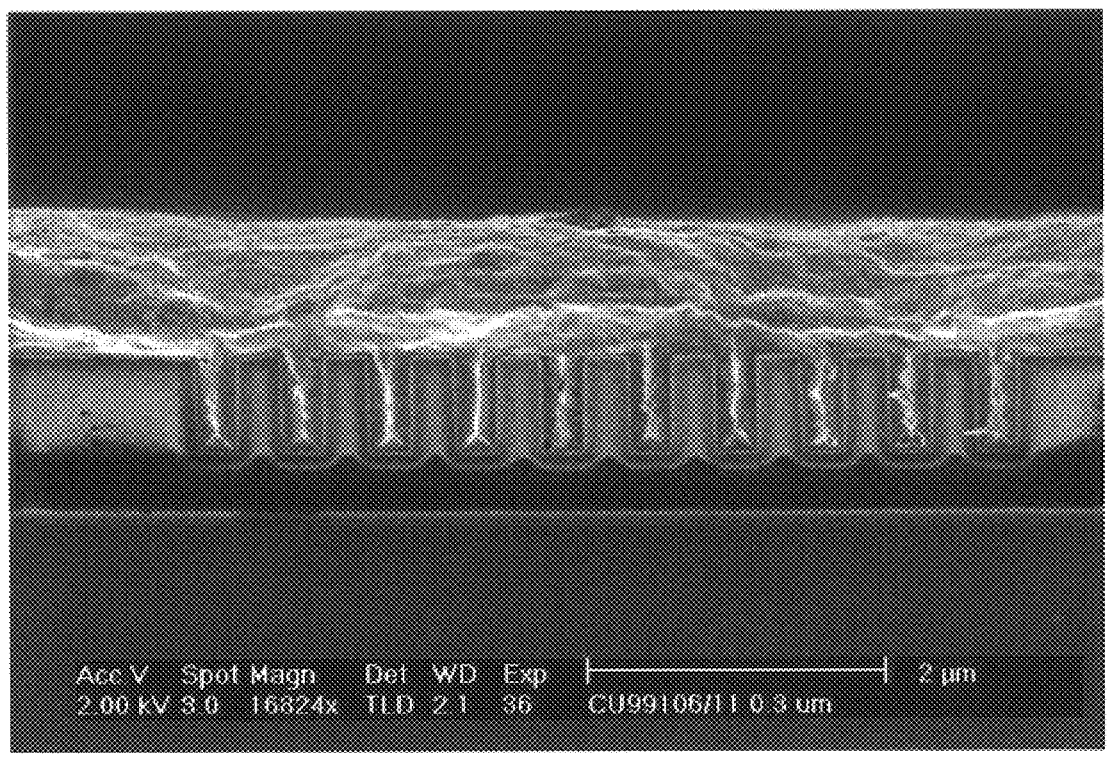
FIG. 3 shows that no overfill is present over dense 0.25 $\mu$m lines with a 3 step process according to the present invention.

FIG. 3 displays the copper layer overlying dense trench structure according to this processing. A 3-step approach was used as route. It clearly indicates that no "overfill" is observed anymore. The processing sequence that was used in detail is as follows: step 1 —electrochemical deposition of Cu; step 2 —interruption of the deposition process and annealing at 120° C. in a conventional furnace under a nitrogen (N2) ambient; and step 3 —further filling of the opening by electrochemical deposition.

What is claimed is:

1. A method for depositing a metal-containing film from a metal-plating bath on a substrate having at least one opening in an insulating layer, said film comprising two or more deposited metal-containing layers, said method comprising the steps of:

a) depositing a metal-containing layer from said metal plating bath on said substrate, thereby producing a first deposited metal-containing layer in at least one opening, said deposited metal-containing layer having impurities incorporated therein or adhered to the surface thereof; thereafter b) performing at least one of a heating step and a vacuum step on said deposited metal-containing layer, whereby the impurities incorporated in said deposited metal-containing layer or adhered to the surface of said deposited metal-containing layer are substantially eliminated; and thereafter c) depositing an additional metal-containing layer from said metal plating bath on said deposited metal-containing layer, whereby said opening in said insulating layer is substantially filled with said metal-containing film.

2. The method as recited in claim 1, further comprising the step of repeating one or more times one or more of steps b) and c), whereby each said opening in said insulating layer is substantially filled with said deposited metal-containing layers.

3. The method as recited in claim 1, wherein at least one metal-containing layer is selected from the group consisting of a copper layer and a cobalt layer.

4. The method as recited in claim 1, wherein the step of performing a vacuum comprises exposing a deposited metal-containing layer in an air/vacuum-cycle.

5. The method as recited in claim 1, wherein said opening is a narrow opening in an insulating layer in an ULSI metallization structure.

6. The method as recited in claim 5, wherein said narrow opening is selected,from the group consisting of a trench, a contact hole, and a via.

7. The method as recited in claim 1, further comprising a step of depositing a metal-containing seed layer, wherein said step is performed prior to step a).

8. The method as recited in claim 1, wherein said metal plating bath is selected from the group consisting of an electroless metal-containing plating bath and an electrolytic metal-containing plating bath.

9. A method for depositing a metal-containing film from a metal plating bath on a substrate, said substrate having a narrow opening in an insulating layer and said metal-containing film comprising two or more metal-containing layers, the method comprising the steps of:

a) depositing a metal-containing layer from said metal-plating bath on said substrate, thereby producing a deposited metal-containing layer, said deposited metal-containing layer having impurities incorporated therein or adhered to the surface thereof; thereafter b) performing at least one of a heating step and a vacuum step on said deposited metal-containing layer, whereby the impurities incorporated in said deposited metal-containing layer or adhered to the surface of said deposited metal-containing layer are substantially eliminated; and c) repeating steps a) and b) one or more times, whereby said opening in said insulating layer is substantially filled with said metal-containing film.

10. The method as recited in claim 9, wherein at least one metal-containing layer is selected from the group consisting of a copper layer and a cobalt layer.

11. The method as recited in claim 9, wherein the step of performing a vacuum comprises exposing the deposited metal-containing layer in an air/vacuum-cycle.

12. The method as recited in claim 9, wherein said opening is a narrow opening in an insulating layer in an ULSI metallization structure.

13. The method as recited in claim 12, wherein said narrow opening is selected from the group consisting of a trench, a contact hole, and a via.

14. The method as recited in claim 9, further comprising the step of depositing a metal-containing seed layer on said substrate, wherein said step is performed prior to step a).

15. The method as recited claim 9, wherein said metal plating bath is selected from the group consisting of an electroless metal-containing plating bath and an electrolytic metal-containing plating bath.

* * * * *